US008719648B2

(12) United States Patent
Gorman et al.

(10) Patent No.: US 8,719,648 B2
(45) Date of Patent: May 6, 2014

(54) INTERLEAVING OF MEMORY REPAIR DATA COMPRESSION AND FUSE PROGRAMMING OPERATIONS IN SINGLE FUSEBAY ARCHITECTURE (75) Inventors: Kevin W. Gorman, Cambridge, VT (US); Michael R. Ouellette, Westford, VT (US); Michael A. Ziegerhofer, Jeffersonville, VT (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 13/192,051

(22) Filed: Jul. 27, 2011

(65) Prior Publication Data
US 2013/0031319 A1 Jan. 31, 2013

(51) Int. Cl.
G11C 29/00 (2006.01)

(52) U.S. Cl.
USPC ............................................ 714/723; 714/710

(58) Field of Classification Search
USPC .................................................. 714/710, 723
See application file for complete search history.

(56) References Cited

U.S. PATENT DOCUMENTS

| 5,111,457 | A | 5/1992 | Rabjohns et al. |
| 5,134,616 | A | 7/1992 | Barth, Jr. et al. |
| 5,610,534 | A | 3/1997 | Galbraith et al. |
| 5,732,202 | A | 3/1998 | Okamoto |
| 6,038,179 | A | 3/2000 | Eustis et al. |
| RE36,952 | E | 11/2000 | Zagar et al. |
| 6,333,878 | B2 | 12/2001 | Ooishi |
| 6,367,042 | B1 | 4/2002 | Phan et al. |
| 6,434,066 | B1 | 8/2002 | Waller et al. |
| 6,496,431 | B1 * | 12/2002 | Nakahara et al. ............. 365/200 |
| 6,577,156 | B2 * | 6/2003 | Anand et al. .................... 326/37 |
| 6,651,202 | B1 | 11/2003 | Phan |
| 6,757,204 | B2 | 6/2004 | Di Ronza et al. |
| 6,766,468 | B2 | 7/2004 | Barth, Jr. et al. |
| 6,768,694 | B2 * | 7/2004 | Anand et al. ............... 365/225.7 |
| 6,856,569 | B2 * | 2/2005 | Nelson et al. ............... 365/225.7 |
| 6,898,143 | B2 | 5/2005 | Puri et al. |
| 6,922,649 | B2 | 7/2005 | Mondal et al. |
| 6,961,890 | B2 | 11/2005 | Smith |
| 7,035,158 | B2 | 4/2006 | Kozuka |
| 7,043,672 | B2 | 5/2006 | Merritt |
| 7,047,466 | B2 * | 5/2006 | Meaney et al. ............... 714/726 |
| 7,069,484 | B2 | 6/2006 | Beffa |
| 7,085,182 | B2 | 8/2006 | Collura et al. |
| 7,089,136 | B2 | 8/2006 | Anand et al. |
| 7,093,171 | B2 | 8/2006 | Hsu et al. |

(Continued)

OTHER PUBLICATIONS

Agarwal et al., "An Approximation to the Greedy Algorithm for Differential Compression", Jan. 2006, pp. 149-166, IBM J. Res. & Dev., vol. 50, No. 1.

(Continued)

*Primary Examiner* — Joseph D Torres
(74) *Attorney, Agent, or Firm* — David A. Cain; Hoffman Warnick LLC (57) ABSTRACT

An approach for interleaving memory repair data compression and fuse programming operations in a single fusebay architecture is described. In one embodiment, the single fusebay architecture includes a multiple of pages that are used with a partitioning and interleaving approach to handling memory repair data compression and fuse programming operations. In particular, for each page in the single fusebay architecture, a memory repair data compression operation is performed on memory repair data followed by a fuse programming operation performed on the compressed memory repair data.

24 Claims, 5 Drawing Sheets

(56) References Cited

U.S. PATENT DOCUMENTS

| | | |
|---|---|---|
| 7,162,669 B2 | 1/2007 | Gross |
| 7,170,299 B1 | 1/2007 | Anand et al. |
| 7,174,486 B2 * | 2/2007 | Adams et al. ............... 714/710 |
| 7,218,561 B2 | 5/2007 | Cowles et al. |
| 7,237,154 B1 | 6/2007 | Zorian |
| 7,251,756 B2 | 7/2007 | Anand et al. |
| 7,269,765 B1 | 9/2007 | Charlton et al. |
| 7,286,419 B2 | 10/2007 | Doi |
| 7,289,382 B2 | 10/2007 | Mozdzen |
| 7,359,243 B2 | 4/2008 | Ha |
| 7,359,261 B1 | 4/2008 | Wu et al. |
| 7,373,573 B2 | 5/2008 | Riley |
| 7,379,357 B2 | 5/2008 | Kang |
| 7,406,620 B2 | 7/2008 | Shubat et al. |
| 7,407,113 B2 | 8/2008 | Guterman |
| 7,415,640 B1 * | 8/2008 | Zorian et al. ............... 714/711 |
| 7,432,755 B1 | 10/2008 | Park et al. |
| 7,477,565 B2 | 1/2009 | Nam et al. |
| 7,490,276 B1 | 2/2009 | White et al. |
| 7,493,541 B1 | 2/2009 | Agrawal et al. |
| 7,512,838 B2 | 3/2009 | Rector et al. |
| 7,518,899 B2 | 4/2009 | Perry et al. |
| 7,538,410 B2 | 5/2009 | Yang |
| 7,551,470 B2 | 6/2009 | Erickson et al. |
| 7,627,792 B2 | 12/2009 | Di Ronza et al. |
| 7,698,608 B2 | 4/2010 | Riley |
| 7,704,805 B1 | 4/2010 | Cheng et al. |
| 7,721,119 B2 | 5/2010 | Capps, Jr. et al. |
| 7,724,600 B1 | 5/2010 | Im et al. |
| 7,757,135 B2 | 7/2010 | Nadeau-Dostie et al. |
| 7,774,660 B2 | 8/2010 | Hsu et al. |
| 7,791,972 B2 | 9/2010 | Ouelette et al. |
| 7,818,490 B2 | 10/2010 | Conley |
| 7,839,707 B2 | 11/2010 | Aakjer |
| 7,895,028 B2 | 2/2011 | Anand et al. |
| 8,024,626 B2 * | 9/2011 | Adams et al. ............... 714/710 |
| 2002/0101777 A1 * | 8/2002 | Anand et al. ............... 365/225.7 |
| 2004/0123262 A1 * | 6/2004 | Shirota et al. ............... 716/14 |
| 2007/0047343 A1 * | 3/2007 | Adams et al. ............... 365/200 |
| 2008/0266956 A1 | 10/2008 | Byeon et al. |
| 2009/0016129 A1 | 1/2009 | Anand et al. |
| 2009/0122589 A1 * | 5/2009 | Chang ............... 365/96 |
| 2009/0190422 A1 | 7/2009 | Khoja et al. |
| 2009/0285024 A1 | 11/2009 | Kang |
| 2010/0284222 A1 | 11/2010 | Jang |
| 2012/0155184 A1 | 6/2012 | Kang |

OTHER PUBLICATIONS

Dinh, Notice of Allowance and Fee(s) Due for U.S. Appl. No. 13/223,949 dated May 8, 2013, 17 pages.

Tran, Notice of Allowance and Fee(s) Due for U.S. Appl. No. 13/198,894 dated Feb. 12, 2013, 14 pages.

Alphonse, Notice of Allowance and Fee(s) Due for U.S. Appl. No. 13/204,929 dated Mar. 1, 2013, 15 pages.

* cited by examiner

INTERLEAVING OF MEMORY REPAIR DATA COMPRESSION AND FUSE PROGRAMMING OPERATIONS IN SINGLE FUSEBAY ARCHITECTURE

BACKGROUND

The present invention relates generally to testing memory elements in integrated circuit devices for defects and using electronically programmed fuses to replace defective memory elements. More specifically, embodiments of the present invention are directed to interleaving memory repair data compression and fuse programming operations as a single combinable operation in a single fusebay architecture.

Embedded memories are generally the most dense components used in integrated circuit devices such as application specific integrated circuit (ASIC) and systems on chip (SOC) designs. During the manufacturing process of ASIC and SOC devices, these memories are sensitive to process defects that can cause failures. These memory failures may adversely impact the ability of ASIC and SOC devices to operate in their intended manner. In order to account for such failures, embedded memories are typically designed to have redundant memory in the form of additional columns, rows or locations. The redundant memory can be dynamically substituted for locations within a particular memory that have been diagnosed during a testing phase as exhibiting failure characteristics. Thus, when an ASIC or SOC device is powered up, information is conveyed to the memory, at the time of start up, instructing it to access a location within the redundant memory whenever a failed memory location is sought to be accessed. As long as the redundant memory locations may be accessed as proxies for failed memory locations, these memories are considered to be repaired and available for use within ASIC and SOC devices.

Electronically programmed fuses are typically used to repair the embedded memories with repair data that enables redundant memory locations to be accessed as proxies for failed memory locations. The fuses are typically polysilicon links that are electronically programmed to one of two logic states to represent repair data generated from built-in self tests (BISTs) of the memories that are performed during the testing phase. Typically, a "blown" fuse represents a logical "1", while an intact fuse represents a logical "0".

One type of self-test and repair architecture that has been used with integrated circuit devices such as ASIC and SOC devices includes the use of multiple fusebays to program repair data. In such an architecture, a primary fusebay, a secondary fusebay and a tertiary fusebay are used in conjunction with a fuse controller to fuse repair data based on performing three repair passes of the memories. The primary repair pass, which is done at wafer level, performs the majority of the fuses, while the secondary repair pass performs less fuses and the tertiary repair performing even fewer fuses. In particular, during the primary repair pass, repair data that is stored in a repair register is unloaded from the register upon completion of the BISTs and compressed by the fuse controller. This compressed data is then stored in the primary fusebay. In the secondary repair pass, the BISTs are rerun with the primary repair solutions generated from the prior tests. New failures are added to the repair register and are unloaded and compressed by the fuse controller upon completion of the BISTs. This compressed data is then stored in the secondary fusebay. Similarly, during the tertiary repair pass, BISTs are rerun with the primary and secondary repair solutions, and any new failures are compressed and stored in the tertiary fusebay. The final repair solutions for the memories are then obtained by first decompressing the repair solutions from each of the fusebays and then performing fusing and comparison operations.

A benefit of using a multi-fusebay architecture that includes a primary fusebay, a secondary fusebay, and a tertiary fusebay is that the compressing of repair data followed by programming of the repair data occurs simply as two separate operations. More specifically, all of the repair data is compressed in one operation and then all of the compressed repair data is programmed in another separate operation. However, with the ever increasing number of fuses being used in integrated circuit devices (sometimes doubling with each successive technology node), the amount of logic associated with each individual fuse is prohibitively excessive with respect to maintaining competitiveness in area overhead.

SUMMARY

In one embodiment, there is a structure that comprises a plurality of fuse macros arranged in a serial configuration. Each fuse macro is organized with rows and columns having programmable fuse elements. Each row in a fuse macro is concatenated with a corresponding row in an adjacent fuse macro. Each concatenated row across the plurality of fuse macros forms a fuse page of programmable fuses. Each of the fuse pages formed across each of the rows of the plurality of fuse macros define a plurality of fuse pages arranged in a vertical configuration. A fuse register is shared across each of the rows of the plurality of fuse macros for each of the plurality of fuse pages in the fuse macros. The fuse register is separated into segments arranged in a serial configuration that are each configured to interface with each of the rows and fuse pages in one of the plurality of fuse macros. A fuse controller facilitates a memory repair data compression operation and a fuse programming operation performed within the plurality of fuse macros and the fuse register on repair data stored in a repair register. The memory repair data compression operation and the fuse programming operation are performed as a single combinable operation that includes partitioning the memory repair data compression operation into a plurality of compression operations, partitioning the fuse programming operation into a plurality of fuse programming operations, and interleaving the plurality of partitioned compression operations with the plurality of partitioned fuse programming operations, wherein a first partitioned memory repair data compression operation is performed and a first partitioned fuse programming operation is performed upon completion of the first partitioned memory repair data compression operation, a second partitioned memory repair data compression operation is performed after completing the first partitioned fuse programming operation and a second partitioned fuse programming operation is performed upon completion of the second partitioned memory repair data compression operation, the interleaving sequence of performing the partitioned memory repair data compression operations with the partitioned fuse programming operations continuing until the repair data in the repair register has been exhausted and reprogrammed by the plurality of fuse macros.

In a second embodiment, there is a method for combining a memory repair data compression operation and a fuse programming operation into a single operation performed on repair data stored in a repair register. The method comprises: partitioning the memory repair data compression operation into a plurality of compression operations; partitioning the fuse programming operation into a plurality of fuse programming operations; and interleaving the plurality of partitioned compression operations with the plurality of partitioned fuse programming operations, wherein a first partitioned memory repair data compression operation is performed and a first partitioned fuse programming operation is performed upon completion of the first partitioned memory repair data compression operation, a second partitioned memory repair data compression operation is performed after completing the first partitioned fuse programming operation and a second partitioned fuse programming operation is performed upon completion of the second partitioned memory repair data compression partition operation, the interleaving sequence of performing the partitioned memory repair data compression operations with the partitioned fuse programming operations continuing until the repair data in the repair register has been exhausted.

In a third embodiment, there is a computer-readable medium storing computer instructions, which when executed, enable a computer system to combine a memory repair data compression operation and a fuse programming operation into a single operation performed on repair data stored in a repair register. The computer instructions causing the computer system to perform actions comprising: partitioning the memory repair data compression operation into a plurality of compression operations; partitioning the fuse programming operation into a plurality of fuse programming operations; and interleaving the plurality of partitioned compression operations with the plurality of partitioned fuse programming operations, wherein a first partitioned memory repair data compression operation is performed and a first partitioned fuse programming operation is performed upon completion of the first partitioned memory repair data compression operation, a second partitioned memory repair data compression operation is performed after completing the first partitioned fuse programming operation and a second partitioned fuse programming operation is performed upon completion of the second partitioned memory repair data compression operation, the interleaving sequence of performing the partitioned memory repair data compression operations with the partitioned fuse programming operations continuing until the repair data in the repair register has been exhausted.

In a fourth embodiment, there is an integrated circuit die that comprises a memory array; a repair register configured to store memory repair data generated from a test performed on the memory array; and a fusebay configured to reprogram defective memory elements within the memory array with the memory repair data. The fusebay includes a plurality of fuse macros arranged in a serial configuration. Each fuse macro is organized with rows and columns having programmable fuse elements, wherein each row in a fuse macro is concatenated with a corresponding row in an adjacent fuse macro. Each concatenated row across the plurality of fuse macros forms a fuse page of programmable fuses. Each of the fuse pages formed across each of the rows of the plurality of fuse macros defines a plurality of fuse pages arranged in a vertical configuration. A fuse register is shared across each of the rows of the plurality of fuse macros for each of the plurality of fuse pages in the fuse macros. The fuse register is separated into segments arranged in a serial configuration that are each configured to interface with each of the rows and fuse pages in one of the plurality of fuse macros. A fuse controller facilitates an interleaved sequence of memory repair data compression operations performed within the fuse register with fuse programming operations performed across the fuse pages of the plurality of fuse macros on the memory repair data stored in the repair register.

DETAILED DESCRIPTION

Figure 1:
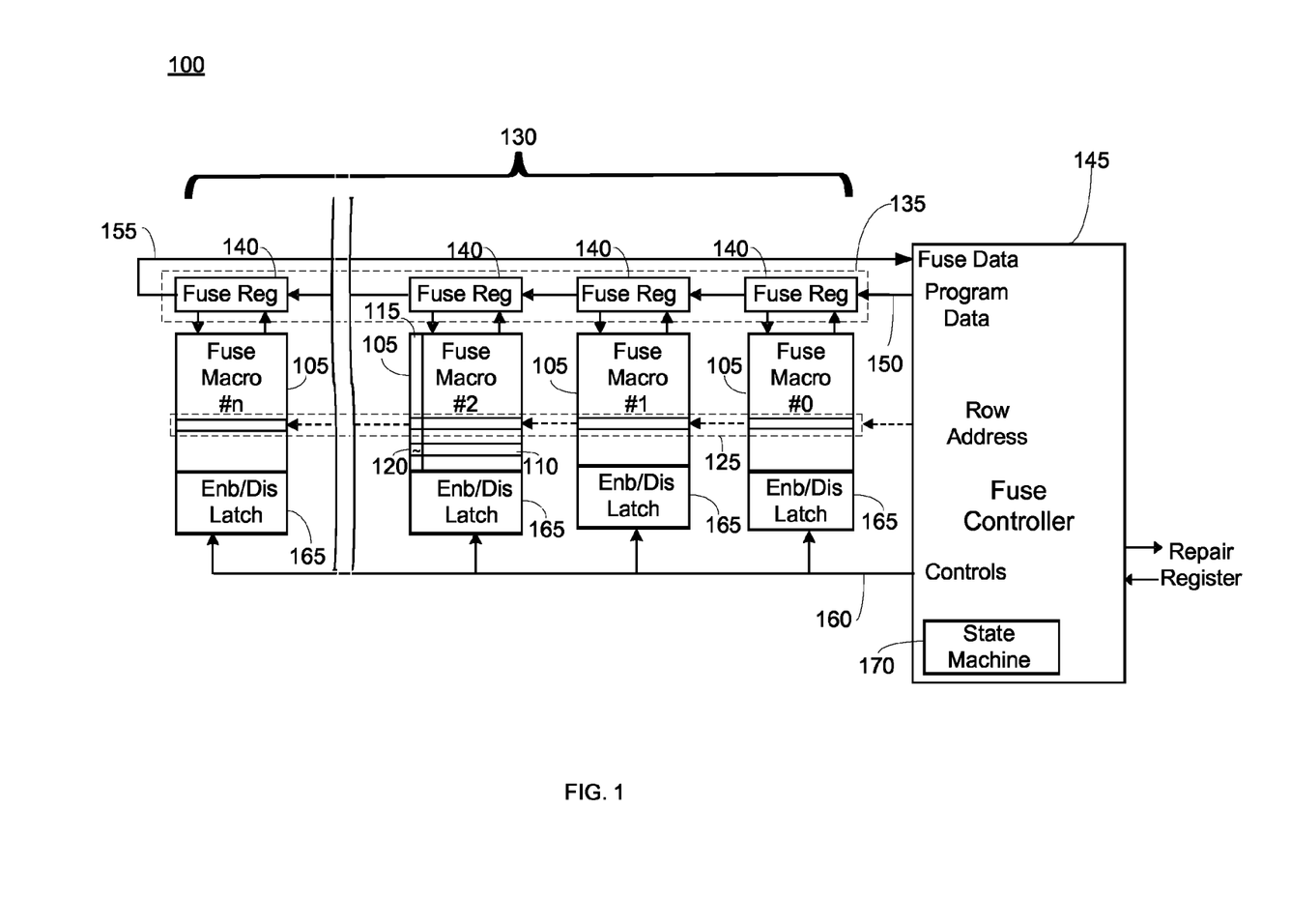
FIG. 1 shows a schematic diagram of a single fusebay architecture according to an embodiment of the present invention.

Referring to FIG. 1, there is a schematic diagram of a single fusebay architecture 100 according to an embodiment of the present invention. As shown in FIG. 1, fusebay architecture 100 includes a plurality of fuse macros 105 arranged in a serial configuration. In one embodiment, each fuse macro 105 is organized with rows 110 and columns 115 having programmable fuse elements 120. For sake of simplicity in illustrating the various embodiments of the present invention, only one row 110 and one column 115 and one fuse element 120 in a fuse macro 105 is shown in FIG. 1. Those skilled in the art will recognize that single fusebay architecture 100 would have a lot more rows 110, columns 115 and fuse elements 120 in the fuse macros 105. For example, for a 32 nanometer (nm) ASIC memory structure in which each fuse macro 105 included an array of 64 rows by 64 columns, each macro would have 4096 fuse elements. The amount of fuse elements 120 for the entire single fusebay architecture 100 could increase substantially given that there would be a considerable amount of fuse macros 105 used in a 32 nm structure.

Each row 110 in a fuse macro 105 is concatenated with a corresponding row in an adjacent fuse macro. Again for sake of simplicity in illustrating the various embodiments of the present invention, only one corresponding row 110 across fuse macros 105 is shown as being concatenated (see row enclosed by the dotted-line box), however, all of the corresponding rows across the fuse macros would be concatenated. In one embodiment, each concatenated row across the plurality of fuse macros 105 forms a fuse page 125 of programmable fuse elements 120. For further sake of simplicity in illustrating the various embodiments of the present invention, only one fuse page 125 is shown. In one embodiment, each of the fuse pages 125 formed across each of the rows 110 of the plurality of fuse macros 105 defines a plurality of fuse pages arranged in a vertical configuration. A page length 130 of each fuse page 125 is defined as the number of fuse macros 105 times the number of columns 115 in the macros. In one embodiment, each fuse macro 105 in a 32 nm structure may be formed from an array of 64 rows by 64 columns. As a result, in this embodiment, page length 130 would be defined as n times 64, where n is the number of fuse macros 105. As will be explained below in more detail, the page length 130 of each fuse page 125 is also a function of the number of bit words in the page and the word length of the bit word.

Although the various embodiments of the present invention are described below with respect to a 32 nm structure in which each fuse macro 105 includes an array of 64 rows by 64 columns, those skilled in the art will appreciate that these embodiments can be used in other sized structures such as for example, 8 nm, 45 nm and 65 nm structures. Furthermore, those skilled in the art will appreciate that although the various embodiments of the present invention are described below with respect to fuse macros 105 including an array of 64 rows by 64 columns, these embodiments are suitable for use with fuse macros having different sized arrays, such as for example, an array of 128 rows by 128 columns and an array of 16 rows by 128 columns. Consequently, page length 130 would vary depending on the number of fuse macros used as well as the number of columns used in each macro.

Referring back to FIG. 1, fusebay architecture 100 further includes a fuse register 135 that is shared across each of the rows 110 of the plurality of fuse macros 105 for each of the plurality of fuse pages 125 in the fuse macros. In one embodiment, fuse register 135 is separated into segments 140 arranged in a serial configuration that are each configured to interface with each of the rows 110 and fuse pages 125 in one of the fuse macros 105. FIG. 1 shows that segments 140 of fuse register 135 are separate and distinct in order to show the correspondence with a respective fuse macro 105, however, those skilled in the art will appreciate that segments 140 are essentially joined together as one long register that not only corresponds with fuse macros 105, but also page length 130.

Fusebay architecture 100 also includes a fuse controller 145 that facilitates a memory repair data compression operation and a fuse programming operation performed within fuse macros 105 and fuse register 135 on memory repair data stored in a repair register (not shown in FIG. 1). In one embodiment, the memory repair data compression operation and the fuse programming operation are performed as a single combinable operation that includes partitioning the memory repair data compression operations into a plurality of partitioned compression operations, partitioning the fuse programming operation into a plurality of partitioned fuse programming operations, and interleaving the partitioned plurality of compression operations with the plurality of partitioned fuse programming operations. In particular, a first partitioned memory repair data compression operation is performed and a first partitioned fuse programming operation is performed upon completion of the first partitioned memory repair data compression operation. A second partitioned memory repair data compression operation is then performed after completing the first partitioned fuse programming operation and a second partitioned fuse programming operation is performed upon completion of the second partitioned memory repair data compression operation. The interleaving sequence of performing the partitioned memory repair data compression operations with the partitioned fuse programming operations continues until the memory repair data in the repair register has been exhausted and reprogrammed by the plurality of fuse macros 105.

Fuse controller 145 facilitates the interleaving sequence of performing the partitioned memory repair data compression operations with the partitioned fuse programming operations with fuse register input 150 and fuse register output 155 going into and out of fuse register 135, respectively A control line 160 coupled to enable/disable latches 165 within each fuse macro 105 enables or disables the transfer of compressed memory data from segments 140 of fuse register 135 to a respective fuse page 125 in the macros. As shown in FIG. 1, fuse register input 150 may be connected to one end of fuse register 135, while fuse register output 155 may be connected to the opposite end of the fuse register. Enable/disable latches 165 are activated or deactivated by control line 160. In one embodiment, fuse controller 145 uses control line 160 to enable only one enable/disable latch 165 at a time. Thus, only one fuse macro 105 is enabled to be active to perform a fuse programming operation associated with a given segment 140 of a fuse page 125 as identified by an address 170 provided by the controller. The other fuse macros 105 remain inactive during this fuse programming operation. Further details of the interleaving sequence of performing the partitioned memory repair data compression operations with the partitioned fuse programming operations in conjunction with fuse controller 145, fuse register 135, fuse macros 105, fuse register input 150, fuse register output 155, control line 160 and enable/disable latches 165 are set forth below.

Figure 2:
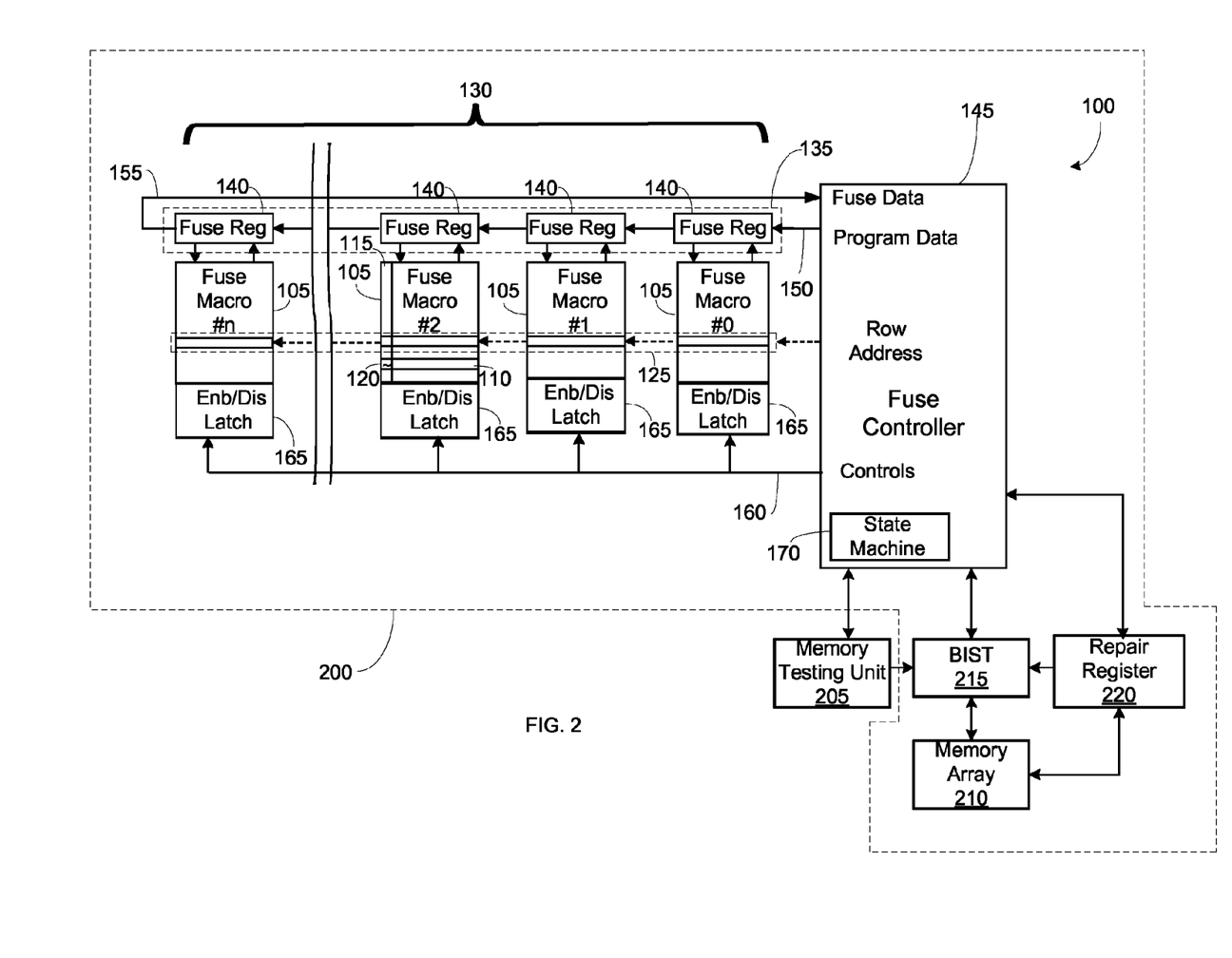
FIG. 2 shows a schematic diagram of the single fusebay architecture of FIG. 1 implemented within an integrated circuit die and used with a memory testing unit according to an embodiment of the present invention.

FIG. 2 shows a schematic diagram of fusebay architecture 100 implemented within an integrated circuit die or chip 200 and used with an external memory testing unit 205 according to an embodiment of the present invention. In addition to fusebay architecture 100, integrated circuit die 200 includes a memory array 210 comprising memory cells (not illustrated) arranged in rows and columns that store bits. Memory array 210 further includes redundant memory cells formed from additional rows and columns that can be dynamically substituted for memory cells that have been diagnosed as exhibiting failure characteristics. Memory array 210 can be in the form of a static random access memory (SRAM) or a dynamic random access memory (DRAM). FIG. 1 only shows one memory array 210 for ease of illustrating the various embodiments of the present invention. Those skilled in the art will recognize that a typical integrated circuit die or chip such as ASIC and SOC devices may utilize a multiple of memory arrays 210.

As shown in FIG. 2, integrated circuit die 200 further includes a built-in self test (BIST) module 215 that is configured to test memory array's 210 ability to perform within design specifications during a testing phase of a semiconductor wafer containing the dies (chips). In one embodiment, BIST module 215 comprises BIST engines that act as an aggregate of state machines that perform a variety of operations. One of these operations includes running through a sequence of standard test patterns to uncover faults in memory array 210. In particular, the BIST engines write the test patterns to memory array 210 in one operation and in another operation reads out the patterns from memory. A comparison is made of the test patterns written to memory array 210 against the patterns read therefrom. The BIST engines stores data indicating the address location of the memory cells within memory array 210 that fail to provide an output that matches the input. This data is referred to as memory repair data and is stored in a repair register 220. In this manner, the addresses of the faulty memory cells within memory array 210 can be identified and repaired using the interleaved sequence of performing memory repair data compression operations with fuse programming operations on the repair data stored in repair register 220. As a result, defective memory addresses are programmed to be rerouted to redundant memory locations. Consequently, when integrated circuit die 200 is powered-up, the programmed fused memory repair data is downloaded back to memory array 210 via repair register 220 in order to enable the redundant memory locations to be swapped in for the fault memory locations when access attempts are made.

Fuse controller 145 facilitates a portion of the operations performed during the testing phase of memory array 210 that is within integrated circuit die 200. In particular, fuse controller 145 facilitates the operations performed by BIST module 215. In addition, fuse controller 145 facilitates the interleaved sequence of performing partitioned memory repair data compression operations with the partitioned fuse programming operations within fuse register 135 and fuse macros 105 on the memory repair data stored in repair register 220.

A memory testing unit 205 controls the aforementioned operations performed in integrated circuit die 200. In particular, memory testing unit 205 provides the appropriate instructions to BIST module 215 to perform the BIST and provides the appropriate instructions to fuse controller 145 to perform the actions associated with the interleaving sequence of performing portioned memory repair data compression operations with partitioned fuse programming operations. In one embodiment, memory testing unit 205 instructs fuse controller 145 to initiate the interleaving of the partitioned memory repair data compression operations with the partitioned fuse programming partition operations as a single combinable operation.

Figure 3:
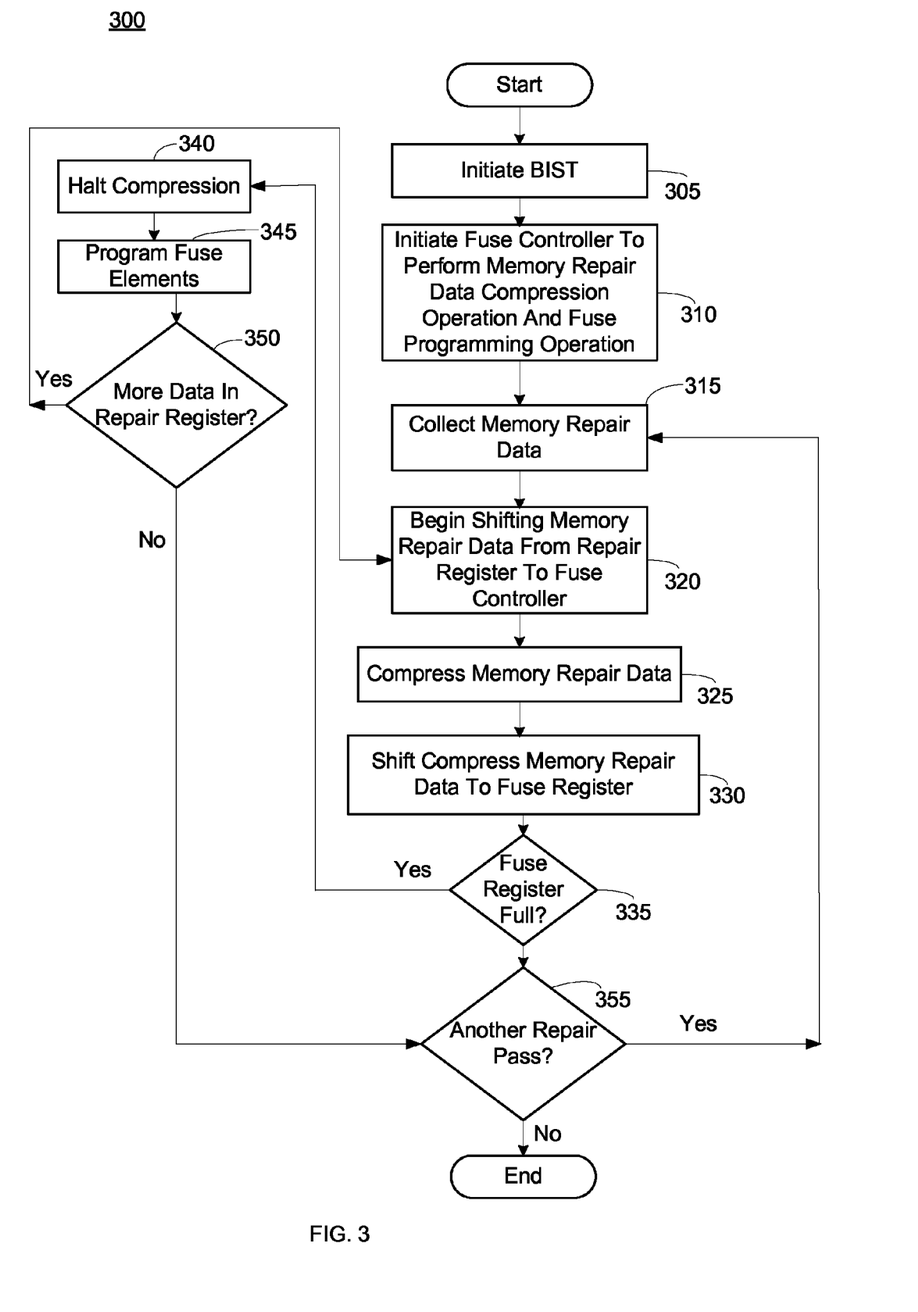
FIG. 3 shows a schematic flow diagram illustrating the interleaving of memory repair data compression and fuse programming operations as a single combinable operation within the single fusebay architecture depicted in FIGS. 1-2 according to an embodiment of the present invention.

FIG. 3 shows a schematic flow diagram 300 describing the interleaving of the partitioned memory repair data compression operations with the partitioned fuse programming operations as a single combinable operation performed within the single fusebay architecture depicted in FIGS. 1-2 according to an embodiment of the present invention. The flow diagram begins at 305 where memory testing unit 205 instructs BIST module 215 to perform a BIST on memory array 210. In addition, memory testing unit 205 initiates fuse controller 145 to perform the single combinable operation of interleaving the partitioned memory repair data compression operations with the partitioned fuse programming operations on memory repair data placed in repair register 220 by BIST module 215 at 310. This facilitates the repair of any faulty memory cells within memory array 210, so that their addresses are programmed to be rerouted to redundant memory locations within the memory array.

During the BIST, repair register 220 collects memory repair data at 315 that is generally indicative of whether addresses within memory array 210 are acceptable or faulty. The memory repair data is in the form of logical "0"s and "1"s, where in one embodiment the logical "0"s may represent memory addresses having acceptable data and the logical "1"s may represent addresses having faulty data. Generally, the memory repair data comprises long strings of data that may have some sporadically placed logical "1"s, a medium length string of logical "1"s, a medium length string of logical "0"s and a longer string of logical "0"s.

Repair register 220 is generally a long register organized into segments that contain memory repair data associated with a specific memory array in integrated circuit die 200. These segments are known as failing address and repair registers (FAARs). Typically, a BIST is run in parallel on all memory arrays in an integrated circuit device. Each FAAR associated with a memory array collects memory repair data. Not all memory arrays will have faulty memory cells, and thus some FAARs will not have repair data (i.e., there will be only logical "0"s), while other FAARs may have some repair data. As mentioned above, for the sake of illustrating the various embodiments of the present invention, integrated circuit die 200 is shown with only one memory array 210, and thus repair register 220 would have only one FAAR register to correspond with the memory array.

Referring back to FIG. 3, flow diagram 300 continues at 320 where the memory repair data from repair register 220 is shifted to fuse controller 145. While the memory repair data is shifted from repair register 220, fuse controller 145, begins performing the single combinable operation of interleaving memory repair data compression operations with the fuse programming operations. In particular, fuse controller 145 compresses the long strings of memory repair data at 325 using well-known compression techniques used on memory repair data. The compressed data is then shifted to fuse register 135 at 330. As mentioned above, fuse register 325 is separated into segments 140 arranged in a serial configuration that are each configured to interface with each of the rows 110 and fuse pages 125 in one of the fuse macros 105. Furthermore, as mentioned above, in one embodiment, each fuse macro 105 may be formed from an array of 64 rows by 64 columns. As a result, each fuse page will have a page length of n times 64, where n is the number of fuse macros 105 in fusebay architecture 100. Consequently, fuse controller 145 shifts the compressed memory repair data into fuse register 135 until the 64 bit register is full. In one embodiment, fuse controller 145 shifts the compressed memory repair data to segments 140 of fuse register 135 one bit at a time in a barrel-type shifting pattern.

At 335, a determination is made as to whether the fuse register 135 is full. When it is determined that fuse register 135 is full, the compression performed by fuse controller 145 is halted or paused at 340. Programmable fuse elements are then blown according to the compressed memory repair data by performing a fuse programming operation at 345. In one embodiment, the fuse programming operation is performed by shifting memory repair data from each segment 140 in fuse register 135 to a common fuse page in each fuse macro 105. In one embodiment, fuse controller 145 enables only one fuse macro 105 at a time so that a pertinent fuse page can receive the memory repair data, while the other macros remain disabled. In particular, fuse controller 145 sends a row address to all of the fuse macros, but only sends a control signal to one enable/disable latch 165 in one fuse macro 105. As a result, memory repair data from a corresponding fuse register segment 140 is then shifted to relevant fuse page of that fuse macro 105. Fuse controller 145 then enables another fuse macro 105 to receive memory repair data in the common fuse page from another corresponding fuse register segment 140, while the other macros are disabled. Fuse controller 145 steps through to the next fuse register segment and shifts the memory repair data to the relevant fuse page. This process continues until compressed memory repair data in each segment 140 has been shifted to the common fuse page in each of fuse macros 105. Fuse macros 105 then perform the programming of the fuse elements for this fuse page. In one embodiment, generally, a high voltage is applied to each of the fuses while a current is applied to integrated circuit die 200. In one embodiment, the fuse elements for a common fuse page are programmed in one fuse macro 105 at a time.

After completing the fuse programming operation for this fuse page across fuse macros 105, a determination is made at 350 to ascertain whether repair register 220 has more data. If repair register 220 contains more memory repair data, the memory repair data compression operation continues at 320. In particular, the memory repair data compression operation continues where it was halted for the fuse programming operation. Again, memory repair data from repair register 220 is shifted to fuse controller 145 at 320 where it is compressed at 325 and shifted to fuse register 135 at 330 until all of segments 140 are filled with data. When it is determined that fuse register 135 is full at 335, the compression is again halted at 340. Programmable fuse elements are then blown by performing another fuse programming operation at 345. In this instance, the fuse programming operation is performed in the aforementioned manner, however, the compressed memory repair data from each segment 140 in fuse register 135 is transferred to the next fuse page in the vertical orientation. Fuse controller 145 then enables one fuse macro 105 at a time so that the next fuse page receives the memory repair data from each segment one at a time. Fuse macros 105 then perform the programming of the fuse elements for this fuse page.

This interleaving of the memory repair data compression operations with the fuse programming operations continues by collecting more repair data in repair register 220, compressing it, shifting the compressed data to segments 140 of fuse register 135, transferring the data to the next fuse page in fuse macros 105 and blowing fuse elements, until it is determined at 350 that there is no more data in the repair register.

In order to perform this interleaved operation, fuse controller 145 generally has to ascertain certain information regarding fuse macros 105, fuse register 135 and repair register 220 to ensure that memory repair data is placed on the respective fuse pages in an ordered fashion and to ensure when to stop performing this operation. In particular, the length of the repair register is one parameter that is used to perform the interleaving sequence of performing the memory repair data compression operations with the fuse programming operations. In one embodiment, fuse controller 145 uses the length of repair register 220 to determine when to stop performing additional interleaving sequences of memory repair data compression operations with fuse programming operations. More specifically, fuse controller 145 uses the length of repair register 220 to determine when it has been exhausted, thus obviating further memory repair data compressions.

Another parameter used in performing the interleaving of the memory repair data compression operations with the fuse programming operations is the length of each fuse page. For example, fuse controller 145 uses the length of each fuse page to determine when the end of fuse register 135 has been filled with compressed memory repair data (e.g., the fuse controller could use a counter to determine when the fuse register has filled up). This then enables fuse controller 145 to halt the memory repair data compression operations in each interleaving sequence in response to determining that the end of the fuse register has been filled with compressed memory repair data. As a result, the fuse programming operation can then be initiated. As mentioned above, for fuse macros 105 containing 64 pages, the length would be n times 64, where n is the number of fuse macros in fusebay architecture 100. For example, in this embodiment, if there are 5 fuse macros 105, then the page length would be 320. Note that the length of the fuse page can be defined as the number of words times the word length. For the example where a fuse macro contains 64 pages, the length of the fuse page would be n+1 (the number of words) times 64 (word length). As mentioned above, the length of a fuse page will vary according to a given design of an integrated circuit die and the amount of fuse macros 105 used in a fusebay architecture.

The process illustrated in flow diagram 300 will continue if it is determined at 355 that another repair pass of memory array 210 was made with BIST module 215. Upon completing the interleaved sequence of performing memory repair data compression operations with the fuse programming operations, the programmed data in each of the fuse macros 105 is ready to be used to control the redundancy memory elements associated with memory array 210 upon powering up integrated circuit device 200. In particular, when integrated circuit die 200 is powered up, the programmed data in each of the fuse macros 105 can be shifted to fuse register 135 and fuse controller 145 where it is decompressed and sent back to repair register 220, and made available to memory array 210. The programmed fuse data from each fuse page in fuse macros 105 would be shifted to segments 140 of fuse register 130 one at a time using enable/disable latches 165 and then to fuse controller 145. This process would be done in a similar manner as described above for performing the memory repair data compression operations with the fuse programming operations, but just done in reverse order.

The foregoing flow chart depicted in FIG. 3 shows some of the operations associated with interleaving memory repair data compression operations with fuse programming operations as a single combinable operation within the single fusebay architecture depicted in FIGS. 1-2. In this regard, each block represents a process act associated with performing these operations. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the operations may be added.

By interleaving memory repair data compression operations with fuse programming operations as a single combinable operation within single fusebay architecture 100 in the aforementioned manner, it becomes apparent that this approach allows integrated circuit designers to reduce the amount of logic associated with each individual fuse. In particular, this approach allows designers to use one fuse register bit for each fuse element in a fuse page. Consequently, this reduces the number of fuse register bits that are necessary to store and control the fuse blow of compressed memory repair data. For the embodiment in which fuse macros 105 has 64 fuse pages, the number of fuse register bits are reduced by a factor of 64 as compared to prior art approaches. As a result this provides a substantial logic area reduction for a particular integrated circuit device.

In another embodiment of the present invention, an approach is disclosed that optimizes the total amount of test cycles that memory testing unit 205 needs to perform in order to complete the aforementioned interleaved sequence of performing compression operations with fuse programming operations for a repair pass. More specifically, this embodiment is directed to optimizing the amount of test cycles run by memory testing unit 205 while performing the fuse programming operations within the interleaved sequence across the multiple fuse pages in fuse macros 105. As a result, this embodiment provides additional reduction in the test cycles that is already afforded by using the interleaved sequence of performing compression operations with fuse programming operations. Generally, the amount of time or the number of test cycles to complete an interleaved compression operation with a fuse programming operation for a given repair pass will be dependent upon the length of repair register 220 and the nature of the memory repair data. Since the length of the repair register will vary from one design to the next, and the nature of the memory repair data will vary from one die on a semiconductor wafer to the next, the total amount of time needed to perform the interleaved compression operation with a fuse programming operation will vary by design as well as from die to die on a wafer.

Generally, it takes approximately 500 cycles to blow a fuse across the multiple fuse pages in a 32 nm structure. For example, if there were 128 logical "1"s in the memory repair data, then it would take 64,000 test cycles (128 times 500) to blow these fuses (note that logical "0"s in the compressed memory repair data are skipped over and do not have fuses blown). Those skilled in the art will appreciate that the number of test cycles will vary from one size structure to the next and from one design within that sized structure to the next.

In one embodiment, the total amount of test cycles to complete the interleaved sequence of performing compression operations with fuse programming operations can be determined if the actual number of fuses (i.e., logical "1"s in the memory repair data) that have to be blown across all fuse pages are known in advance, as well as if the actual number of cycles that it would take to compress the memory repair data across all fuse pages are known in advance. If the total amount of test cycles can be determined in advanced from this information, then memory testing unit 205 can use this amount to modify the test patterns applied by BIST module 215, such that only this amount of test cycles is applied to a die on a semiconductor wafer that is under test. Shutting off memory testing unit 205 at the appropriate instance obviates the possibility that the testing unit will undergo unnecessary test cycles, thus ultimately reducing the amount of test time.

In one embodiment, a software-controlled compression calculation state machine 170 (FIG. 1) may be used in fuse controller 145 to determine the total amount of test cycles that are actually needed to complete the interleaved sequence of performing compression operations with fuse programming operations. This total amount of test cycles may be based on the actual number of fuses that have to be blown across all fuse pages and the actual number of cycles that is necessary to compress the memory repair data across all fuse pages. Memory testing unit 205 can then use the determinations made by the state machine 170 within fuse controller 145 to modify, for each die tested in semiconductor wafer, the test cycle count for the test pattern that is applied in the subsequent interleaved memory repair data compression operations and fuse programming operations.

Figure 4:
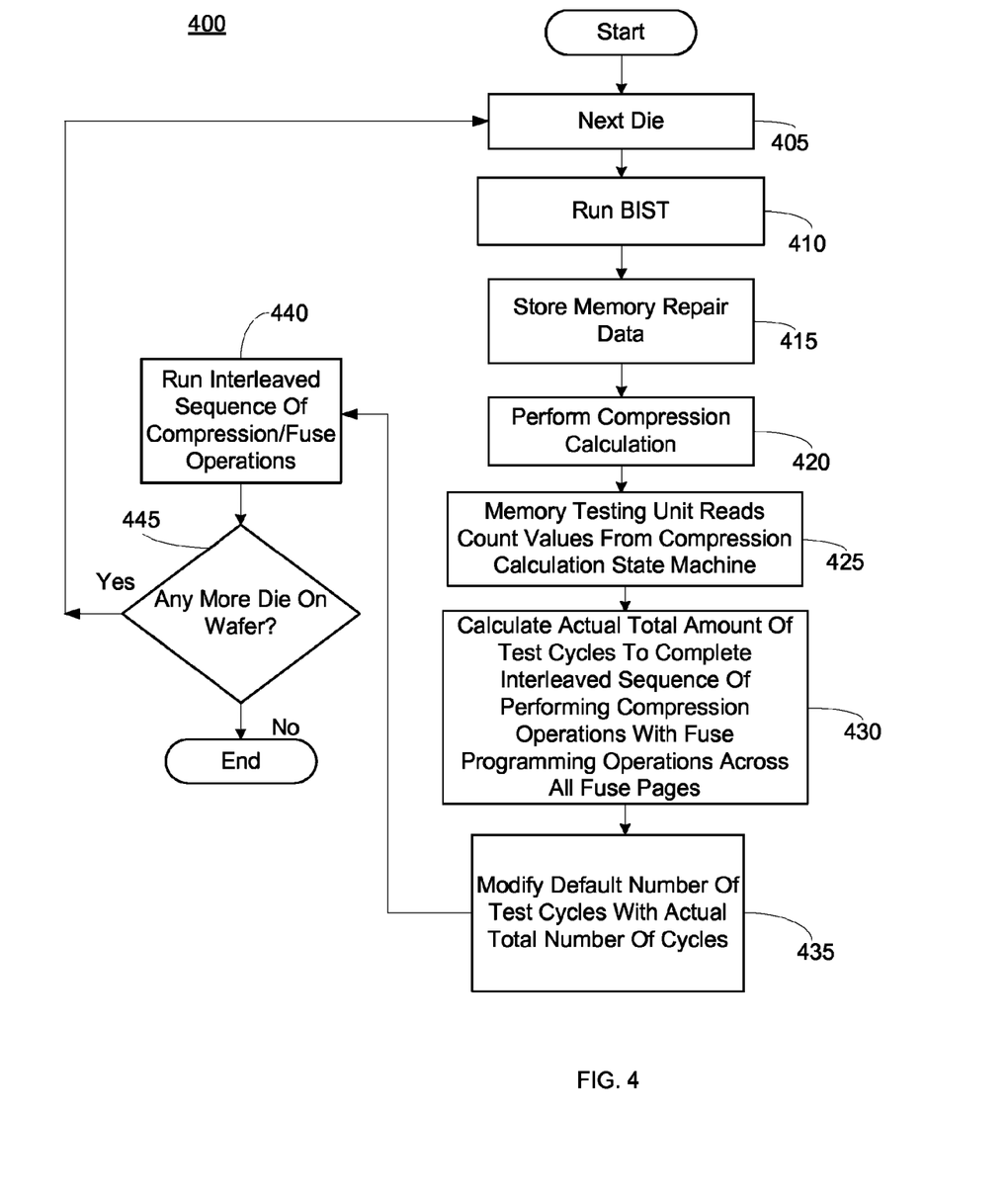
FIG. 4 shows a schematic flow diagram illustrating a process for optimizing the test time of the memory testing unit depicted in FIG. 3 before performing the interleaving of memory repair data compression operations with fuse programming operations according to an embodiment of the present invention.

FIG. 4 shows a schematic flow diagram 400 illustrating a process for optimizing the test time of memory testing unit 205 before performing the interleaving of memory repair data compression operations with fuse programming operations for a particular die on a semiconductor wafer according to an embodiment of the present invention. For each die on the semiconductor wafer that is tested by memory testing unit 205, this process is run to determine the total amount of test cycles that are necessary to complete an interleaved sequence of performing a memory repair data compression operation with a fuse programming operation. Memory testing unit 205 uses the determined total amount of test cycles to modify the test patterns applied by BIST module 215, such that only this amount of test cycles is applied to the die under test for performing the subsequent interleaved memory repair data compression operations with the fuse programming operations.

As shown in FIG. 4, the process starts at 405 where memory testing unit 205 moves to the next die on the semiconductor wafer to perform a series of functional tests, one of which may include testing memory arrays. Next, memory testing unit 205 instructs BIST module 215 to run a BIST at 410. During the BIST, a sequence of standard test patterns is written to the memory arrays in the die, the test patterns are then read from the memory arrays and compared against the test patterns written to the arrays. Data indicating the address location of the memory cells within the memory arrays that fail to provide an output that matches the input is stored in repair register 220 at 415.

Next, a compression calculation is performed at 420. As used herein, a compression calculation is a determination of the actual number of cycles that are needed to compress the memory repair data in repair register for a given repair pass across all of the fuse pages in the fuse macros. During the compression calculation, the new repair data for a given repair pass is shifted from repair register 220 to fuse controller 145. In particular, memory repair data is shifted from repair register 220 to compression calculation state machine 170. In one embodiment, compression calculation state machine 170 compresses the memory repair data and shifts the compressed data into fuse register 135 and its segments 140. During this compression, there are pauses in the shifting of data to create a compression header for each new compression instruction. Compression calculation state machine 170 counts all cycles of compressing and shifting, as well as the pauses to create the headers. In addition, to counting the overall number cycles to perform the compression, compression calculation state machine 170 also counts the number of logical "0"s and "1"s that are shifted out to fuse register 135. In one embodiment, the compression calculation performed by compression calculation state machine 170 is a continuous operation which does not stop when a fuse page for fuse register 135 is filled. Fuse register 135 is simply loaded again with the next pages of compressed data. Note that actual fuse blow operations are not performed at this time; instead fuse programming operations are invoked during the actual performance of the interleaved sequence of memory repair data compression operations with fuse programming operations.

At completion of the compression calculation operation, compression calculation state machine 170 places three counted values in status registers that are associated with fuse controller 145. The first counted value is the number of logical "0"s which represents the number of fuses that will not be programmed. The second counted value is the number of logical "1"s which represents the number of fuses which need to be programmed. The third count value is the number of compression cycles that reflects the total number of tester cycles needed for compression. Referring back to FIG. 4, memory testing unit 205 reads the counted number of logical "0"s, the counted number of logical "1"s, and the counted number of compression cycles from the registers of fuse controller 145 at 425.

Also, at the completion of the compression calculation operation, contents of the data in fuse controller 145 can be shifted back into repair register 220. As a result, repair register 220 returns back to its state prior to the compression calculation operation performed by compression calculation state machine 170. This ensures that the same repair data can be available in repair register 220 for performance of the subsequent interleaved memory repair compression operations with the fuse programming (fuse blow) operations.

A processor within memory testing unit 205 uses these counted values (i.e., the counted number of logical "0"s, logical "1"s, and compression cycles) to calculate actual total number of test cycles that is necessary to complete the interleaved sequence of performing compression operations with fuse programming operations across all fuse pages in fuse macros 105 at 430. The actual total number of test cycles can be determined by multiplying the number of logical "1"s (i.e., number of fuses needed to be blown) by the number of cycles to blow a fuse and adding this amount to the number of logical "0"s (i.e., number of fuses not being blown). This sum results in the number of cycles needed for fuse programming. This number of cycles needed for fuse programming is then added to the number of cycles needed to support the total compression solution across multiple fuse pages. This total count value is the total number of test cycles needed to support the interleaved "compress/fuseblow" operation for that particular die.

In one embodiment, where 32 nm sized structures are being tested, which as mentioned above takes approximately 500 cycles to blow a fuse across multiple fuse pages, the actual total number of test cycles can be determined by adding the number of "0"s to the product of the number of "1"s times 500. This amount (i.e., the number of cycles needed for fuse programming) is added to the number of compression cycles. Because the number of cycles to blow a fuse will vary for different size structures, the actual number of test cycles that is generated from flow diagram 400 will vary from one size structure to the next and from one design within that sized structure to the next.

Referring back to FIG. 4, the process continues at 435 where a default number of test cycles set in memory testing unit 205 is modified or replaced with the actual total number of test cycles determined in 430. In one embodiment, the processor within memory testing unit 205 replaces the default number of tester cycles in the "compress/fuse blow" operation test pattern, with this new value. In most cases, it is believed that the actual number of test cycles that is determined herein will be a much lower value than the default value.

Once the number of test cycles has been modified, the process continues at 440 where the aforementioned interleaved sequence of performing memory repair data compression operations with fuse programming operations are run on the memory repair data in repair register 220. This in turn activates the high voltage used to generate the fuse blow current necessary to program fuse elements in fuse macros 105.

After the interleaved sequence of performing memory repair data compression operations with fuse programming operations are run on the memory repair data across all fuse pages, then a determination is made at 445 to determine whether there are any more die on the semiconductor wafer that need to be tested. If so, then the process operations associated with 405-440 are repeated. The process in flow diagram 400 stops once all of the dies have been tested accordingly. Those skilled in the art will appreciate that subsequent testing can also be performed on these dies. Examples of subsequent testing may include but are not limited to sensing fuses and re-running memory BISTs.

The foregoing flow chart depicted in FIG. 4 shows some of the operations associated with determining the total number of test cycles to support the interleaved "compress/fuseblow" operation for a particular die. In this regard, each block represents a process act associated with performing these operations. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the operations may be added.

Figure 5:
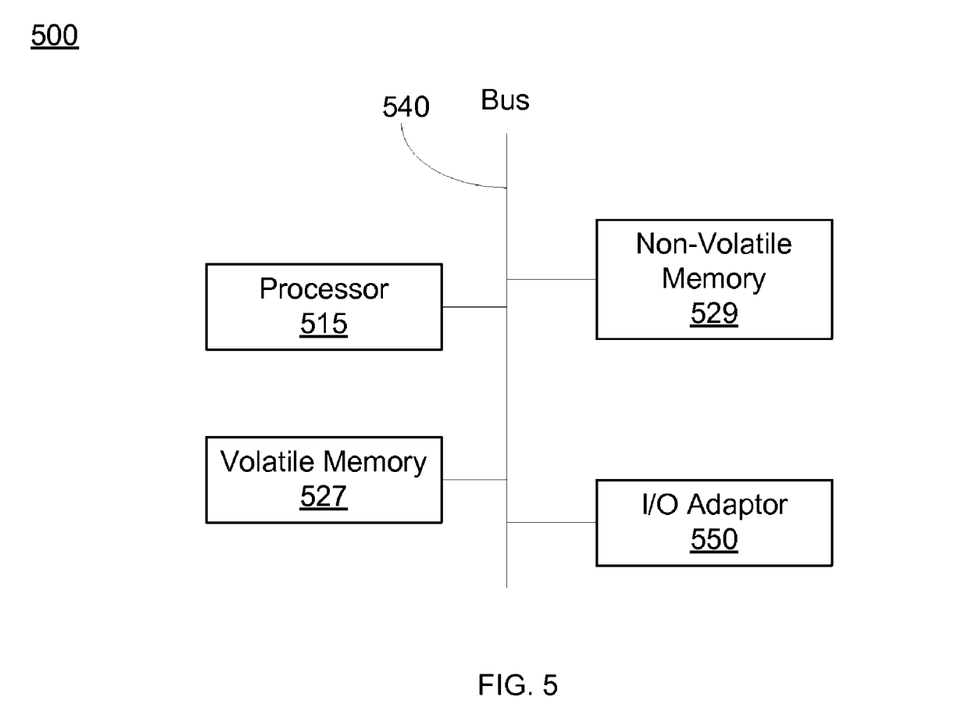
FIG. 5 shows a schematic diagram of a computing environment that may be used to implement embodiments of the present invention.

Referring now to FIG. 5, a schematic diagram of a computing environment 500 is illustrated that may be used to implement the various embodiments of the present invention. Computing environment 500, which in one embodiment may be a microcontroller, can be used to implement fusebay architecture 100 to perform the aforementioned interleaved memory repair compression operations with the fuse programming (fuse blow) operations. In addition, computing environment 500 can be used to facilitate the aforementioned determination of the total number of test cycles needed to support the interleaved operations performed for dies in a semiconductor wafer.

As shown in FIG. 5, computing environment 500 includes a processor 515, a volatile memory 527 (e.g., RAM), and a nonvolatile memory 529 (e.g., ROM). Memory 527 and memory 529 store program instructions (also known as a "software program"), which are executable by processor 515, to implement various embodiments disclosed herein. As shown in FIG. 5, processor 515 and memories 527 and 529 are interconnected by a bus 540. An input/output adapter 550 is also connected to bus 540 to enable information exchange between processor 515 and other devices or circuitry, such as fusebay architecture 100, BIST module 215, repair register 220, and memory testing unit 225 (FIGS. 1-2) in order to perform the processes described in FIGS. 3 and 4.

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A structure, comprising:
a plurality of fuse macros arranged in a serial configuration, each fuse macro organized with rows and columns having programmable fuse elements, wherein each row in a fuse macro is concatenated with a corresponding row in an adjacent fuse macro, each concatenated row across the plurality of fuse macros forming a fuse page of programmable fuses, each of the fuse pages formed across each of the rows of the plurality of fuse macros defining a plurality of fuse pages arranged in a vertical configuration;
a fuse register that is shared across each of the rows of the plurality of fuse macros for each of the plurality of fuse pages in the fuse macros, wherein the fuse register is separated into segments arranged in a serial configuration that are each configured to interface with each of the rows and fuse pages in one of the plurality of fuse macros; and
a fuse controller that facilitates a memory repair data compression operation and a fuse programming operation performed within the plurality of fuse macros and the fuse register on repair data stored in a repair register, the memory repair data compression operation and the fuse programming operation being performed as a single combinable operation that includes partitioning the memory repair data compression operation into a plurality of compression operations, partitioning the fuse programming operation into a plurality of fuse programming operations, and interleaving the plurality of partitioned compression operations with the plurality of partitioned fuse programming operations, wherein a first partitioned memory repair data compression operation is performed and a first partitioned fuse programming operation is performed upon completion of the first partitioned memory repair data compression operation, a second partitioned memory repair data compression operation is performed after completing the first partitioned fuse programming operation and a second partitioned fuse programming operation is performed upon completion of the second partitioned memory repair data compression operation, the interleaving sequence of performing the partitioned memory repair data compression operations with the partitioned fuse programming operations continuing until the repair data in the repair register has been exhausted and reprogrammed by the plurality of fuse macros.

2. The structure according to claim 1, wherein each interleaving sequence of performing a partitioned memory repair data compression operation with a partitioned fuse programming operation comprises the fuse controller compressing memory repair data received from the repair register, shifting the compressed memory repair data to the fuse register, the shifting of the compressed memory repair data to the fuse register halting upon filling the fuse register with the compressed memory repair data, the segments of the fuse register transferring the compressed memory repair data into a corresponding fuse macro onto a fuse page in the vertical configuration of fuse pages, and performing a fuse programming operation on the compressed memory repair data in the fuse page.

3. The structure according to claim 2, further comprising resuming the shifting of the compressed memory repair data to the fuse register upon completing the fuse programming operation on the compressed memory repair data in the fuse page, halting the shifting of the compressed memory repair data to the fuse register upon again filling the register with the compressed memory repair data, the segments of the fuse register transferring the compressed memory repair data into a corresponding fuse macro onto another fuse page, and performing another fuse programming operation on the compressed memory repair data in the another fuse page.

4. The structure according to claim 3, further comprising resuming the shifting of the compressed memory repair data to the fuse register upon completing the another fuse programming operation on the compressed memory repair data in the another fuse page, halting the shifting of the compressed memory repair data to the fuse register upon again filling the register with the compressed memory repair data, the segments of the fuse register transferring the compressed memory repair data into a corresponding fuse macro onto the next fuse page in the vertical configuration of fuse pages, and performing another fuse programming operation on the compressed memory repair data in the next fuse page.

5. The structure according to claim 4, wherein the resuming of the shifting of the compressed memory repair data to the fuse register upon completing a fuse programming operation, halting the shifting of the compressed memory repair data to the fuse register upon again filling the register with the compressed memory repair data, transferring of the compressed memory repair data into a corresponding fuse macro onto the next fuse page in the vertical configuration of fuse pages, and performing another fuse programming operation on the compressed memory repair data continuing until the repair data in the repair register has been exhausted.

6. The structure according to claim 2, wherein the fuse controller controls the transferring of the compressed memory repair data from the segments of the fuse register onto a page of the fuse macros by enabling the transfer of the compressed memory repair data to one fuse macro at a time while the other macros are disabled during the transfer.

7. The structure according to claim 2, wherein the fuse controller controls the performing of the fuse programming operation onto the pages of the fuse macros by enabling the fuse programming operation to occur in one fuse macro at a time.

8. The structure according to claim 1, wherein the interleaving sequence of performing the partitioned memory repair data compression operations with the partitioned fuse programming operations is a function of the length of each fuse page and the length of the repair register.

9. The structure according to claim 8, wherein the length of the fuse page is a function of the number of bit words in the page and the word length of the bit words.

10. The structure according to claim 8, wherein the fuse controller uses the page length to determine when the end of the fuse register has been filled with compressed memory repair data, the fuse controller halting the partitioned memory repair data compression operations in each interleaving sequence in response to determining that the end of the fuse register has been filled with compressed memory repair data, and the fuse controller initiating the partitioned fuse programming operations in response to halting the partitioned memory repair data compression operations.

11. The structure according to claim 8, wherein the fuse controller uses the length of the repair register to determine when to stop performing additional interleaving sequences of partitioned memory repair data compression operations with partitioned fuse programming operations.

12. The structure according to claim 1, further comprising a memory testing unit configured to instruct the fuse controller to initiate the single combinable operation.

13. The structure according to claim 12, wherein the memory testing unit reduces the number of test cycles to complete an interleaved sequence of performing partitioned compression operations with partitioned fuse programming operations for a given repair pass across all fuse pages prior to initiating the single combinable operation.

14. The structure according to claim 13, further comprising a compression calculation state machine that receives the repair data in the repair register prior to initiating the single combinable operation, compresses the entire content of the memory repair data, and shifts the compressed memory repair data into the fuse register.

15. The structure according to claim 14, wherein the compression calculation state machine counts the number of logical "0"s in the compressed memory repair data; the number of logical "1"s in the compressed memory repair data; and the number of cycles used to compress the entire content of the memory repair data.

16. The structure according to claim 15, wherein the memory testing unit determines a total amount of test cycles to complete an interleaved sequence of performing partitioned compression operations with partitioned fuse programming operations for a given repair pass, the total amount of test cycles determined as a function of the count of the number of logical "0"s, the count of the number of logical "1"s and the count of the number of cycles used to compress the entire content of the memory repair data.

17. The structure according to claim 16, wherein the total amount of test cycles is determined by multiplying the number of logical "1"s by the number of cycles to blow a fuse element and adding this amount to the number of logical "0"s, resulting in the number of cycles needed for fuse programming, the number of cycles needed for fuse programming added to the number of cycles used to compress the entire content of the memory repair data to generate the total number of test cycles.

18. The structure according to claim 16, wherein the memory testing unit replaces a default number of test cycles with the determined total amount of test cycles, enabling the memory testing unit to support a subsequent performance of the single combinable operation on a particular die in a semiconductor wafer.

19. The structure according to claim 18, wherein the memory testing unit modifies an original test pattern that was to be used with the single combinable operation for a particular die in a semiconductor wafer, the original test pattern being modified as a function of the determined total amount of test cycles, the modified test pattern being used in subsequent performance of the single combinable operation on the particular die in the semiconductor wafer.

20. A method for combining a memory repair data compression operation and a fuse programming operation into a single operation performed on repair data stored in a repair register, the method comprising:

partitioning the memory repair data compression operation into a plurality of compression operations;

partitioning the fuse programming operation into a plurality of fuse programming operations; and     interleaving the plurality of partitioned compression operations with the plurality of partitioned fuse programming operations, wherein a first partitioned memory repair data compression operation is performed and a first partitioned fuse programming operation is performed upon completion of the first partitioned memory repair data compression operation, a second partitioned memory repair data compression operation is performed after completing the first partitioned fuse programming operation and a second partitioned fuse programming operation is performed upon completion of the second partitioned memory repair data compression partition operation, the interleaving sequence of performing the partitioned memory repair data compression operations with the partitioned fuse programming operations continuing until the repair data in the repair register has been exhausted.

21. The method according to claim 20, wherein each interleaving sequence of performing a partitioned memory repair data compression operation with a partitioned fuse programming operation comprises compressing memory repair data from the repair register, shifting the compressed memory repair data to a fuse register, the shifting of the compressed memory repair data to the fuse register halting upon filling the fuse register with the compressed memory repair data, transferring the compressed memory repair data onto a fuse page in a vertical configuration of fuse pages, and performing a fuse programming operation on the compressed memory repair data in the fuse page.

22. The method according to claim 21, further comprising resuming the shifting of the compressed memory repair data to the fuse register upon completing the fuse programming operation on the compressed memory repair data in the fuse page, halting the shifting of the compressed memory repair data to the fuse register upon again filling the register with the compressed memory repair data, transferring the compressed memory repair data onto another fuse page, and performing a another fuse programming operation on the compressed memory repair data in the another fuse page.

23. The method according to claim 22, wherein the resuming of the shifting of the compressed memory repair data to the fuse register upon completing a fuse programming operation, halting the shifting of the compressed memory repair data to the fuse register upon again filling the fuse register with the compressed memory repair data, transferring of the compressed memory repair data onto the next fuse page in the vertical configuration of fuse pages, and performing another fuse programming operation on the compressed memory repair data continuing until the repair data in the repair register has been exhausted.

24. A computer-readable medium storing computer instructions, which when executed, enable a computer system to combine a memory repair data compression operation and a fuse programming operation into a single operation performed on repair data stored in a repair register, the computer instructions causing the computer system to perform actions comprising:

partitioning the memory repair data compression operation into a plurality of compression operations;

partitioning the fuse programming operation into a plurality of fuse programming operations; and     interleaving the plurality of partitioned compression operations with the plurality of partitioned fuse programming operations, wherein a first partitioned memory repair data compression operation is performed and a first partitioned fuse programming operation is performed upon completion of the first partitioned memory repair data compression operation, a second partitioned memory repair data compression operation is performed after completing the first partitioned fuse programming operation and a second partitioned fuse programming operation is performed upon completion of the second partitioned memory repair data compression operation, the interleaving sequence of performing the partitioned memory repair data compression operations with the partitioned fuse programming operations continuing until the repair data in the repair register has been exhausted.

\* \* \* \* \*